(12) United States Patent
Negron et al.

(10) Patent No.: US 7,336,500 B1
(45) Date of Patent: Feb. 26, 2008

(54) METHOD AND APPARATUS FOR ENCAPSULATING A PRINTED CIRCUIT BOARD

(75) Inventors: Marcus Negron, Santa Cruz, CA (US); Michael Phipps, Aptos, CA (US)

(73) Assignee: Altera Corporation, San Jose, CA (US)

( * ) Notice: Subject to any disclaimer, the term of this patent is extended or adjusted under 35 U.S.C. 154(b) by 54 days.

(21) Appl. No.: 10/934,949

(22) Filed: Sep. 3, 2004

(51) Int. Cl.
*H05K 7/14* (2006.01)

(52) U.S. Cl. .................... 361/752; 361/757; 361/730; 361/728; 174/521; 174/522

(58) Field of Classification Search ........... 361/770, 361/758, 804, 742, 728, 730, 752, 757, 736; 174/52.2, 520–522; 29/830–831
See application file for complete search history.

(56) References Cited

U.S. PATENT DOCUMENTS

| | | | | |
|---|---|---|---|---|
| 5,319,522 A | * | 6/1994 | Mehta | 361/748 |
| 5,365,411 A | * | 11/1994 | Rycroft et al. | 362/20 |
| 5,585,783 A | * | 12/1996 | Hall | 340/473 |
| 6,284,983 B1 | * | 9/2001 | Lutschounig et al. | 174/260 |
| 6,355,881 B1 | * | 3/2002 | Braeges et al. | 174/521 |
| 6,713,677 B2 | * | 3/2004 | Fischbach et al. | 174/536 |
| 6,796,020 B2 | * | 9/2004 | Thompson | 29/712 |
| D507,783 S | * | 7/2005 | Phipps et al. | D13/184 |
| D508,026 S | * | 8/2005 | Phipps et al. | D13/184 |
| D508,897 S | * | 8/2005 | Phipps et al. | D13/184 |
| D510,916 S | * | 10/2005 | Phipps et al. | D13/184 |
| 7,158,020 B2 | * | 1/2007 | Grady, Jr. | 340/473 |
| 2004/0046678 A1 | * | 3/2004 | Grady, Jr. | 340/908 |

\* cited by examiner

*Primary Examiner*—Tuan T. Dinh
*Assistant Examiner*—Dameon E. Levi
(74) *Attorney, Agent, or Firm*—Martine Penilla & Gencarella, LLP

(57) ABSTRACT

A demonstration tool for a programmable logic device is provided. The demonstration tool includes a circuit board partially disposed within a transparent block. A collar having an opening defined therein is disposed between the transparent clock and a base of the demonstration tool. The base is designed to enable access to a bottom portion of the circuit board that extends outside of the transparent block and the collar. The bottom portion of the circuit board includes connection ports to power and configure the programmable logic device. A method for embedding a printed circuit board into a housing is also provided.

16 Claims, 9 Drawing Sheets

METHOD AND APPARATUS FOR ENCAPSULATING A PRINTED CIRCUIT BOARD

BACKGROUND

1. Field of the Invention

This invention relates generally to printed circuit boards and, in particular, to encapsulating a printed circuit board in a transparent housing.

2. Description of the Related Art

Many packaging variations for integrated circuits exist in the semiconductor industry. Integrated circuits are typically packaged to protect the chips from the environment and handling damage, to define interconnections into and out of the chip, to support the chip and to provide heat dissipation. The packaged chip is then incorporated into a printed circuit board. The more common packaging processes, such as plastic packaging techniques, completely encapsulate the wirebonded die and lead-frame in a molding process. The printed circuit board is then incorporated into a final product.

Printed circuit boards are not encapsulated as the printed circuit boards are typically incorporated into a box, e.g., a computer frame, in a manner that allows the printed circuit board to be removable. With the proliferation of computers and computing devices, it has become desirable to demonstrate the components of printed circuit boards. However, a bare printed circuit board is fragile and will not stand up to the wear and tear experienced when used as a demonstration model. Furthermore, the power supply connection to the printed circuit board and other wired connections tend to deteriorate, i.e., break loose, over time through the repeated demonstrations and constant moving around of the demonstration model.

As a result, there is a need to provide a demonstration model for a printed circuit board capable of repeatedly illustrating the features of the integrated circuits of the printed circuit board in an aesthetic manner.

SUMMARY

Broadly speaking, the present invention fills these needs by providing a robust demonstration tool in which part of the printed circuit board is encapsulated. It should be appreciated that the present invention can be implemented in numerous ways, including as a method, a system, or an apparatus. Several inventive embodiments of the present invention are described below.

In one aspect of the invention, a method for embedding a printed circuit board in plastic is provided. The printed circuit board is partially inserted through a collar to expose a top portion when the collar and circuit board are placed into a mold. The mold is then filled with a plastic material that forms a solid block around the top portion of the printed circuit board. The plastic material forms into a solid block after exposure to a curing process, thereby protecting the top portion of the printed circuit board and the corresponding components, while leaving the power supply and other connections exposed. In one embodiment, the plastic material is Polymethyl Methacrylate (also known as LUCITE™) and the top portion of the printed circuit board includes a light emitting diode panel.

In another aspect of the invention, a demonstration tool for a programmable logic device is provided. The demonstration tool includes a circuit board partially disposed within a transparent block. A collar having an opening defined therein is disposed between the transparent clock and a base of the demonstration tool. The base is designed to enable access to a bottom portion of the circuit board that extends outside of the transparent block and the collar. The bottom portion of the circuit board includes connection ports to power and configure the programmable logic device.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

An invention is described for a method and apparatus for a demonstration tool capable of exhibiting the features and functionality of an integrated circuit, such as a programmable logic device. It will be obvious, however, to one skilled in the art, that the present invention may be practiced without some or all of these specific details. In other instances, well known process operations have not been described in detail in order not to unnecessarily obscure the present invention.

As used herein the terms printed circuit board and circuit board are interchangeable and refers to a type of circuit board which has conducting tracks superimposed, or "printed," on one or both sides, and may also contain internal signal layers and power and ground planes. Electronic components are mounted on top of one or both of the sides of the circuit board. The mounted electronic components can either be soldered to the conductor tracks, or interconnected by means of wirebonds (chip and wire) or by solder bumps (flip chip). The circuit board may be a thin, laminated sheet composed of a series of epoxy resin, copper layers and etched electronic circuits. One of the electronic components may be a programmable logic device (PLD). A PLD is a digital, user-configurable integrated circuit used to implement a custom logic function. For the purposes of this description, the term PLD encompasses any digital logic circuit configured by the end-user, and includes a programmable logic array, a field programmable date array, and an erasable and complex PLD.

The embodiments described herein provide for the encapsulation of a printed circuit board in a transparent plastic block, wherein the circuit board includes electronic components mounted thereon. The encapsulated circuit board may be used as an electronic demonstration tool to exhibit the features of the mounted electronic components, e.g., a PLD. It should be appreciated that while, the demonstration tool is discussed with respect to a PLD, this is not meant to be limiting. That is, the demonstration tool may be used to illustrate the features of a microprocessor or any other suitable integrated circuit. The demonstration tool includes a light emitting diode (LED) panel to assist in illustrating the programmability features of a PLD. One skilled in the art will appreciate that the color of the LEDs may be any of the currently available colors for LEDs, e.g., red, yellow, green blue or white. Furthermore, the embodiments described herein are not limited to a LED panel, as any suitable display panel that can withstand the processing conditions described below may be substituted for the LED panel.

Figure 1:
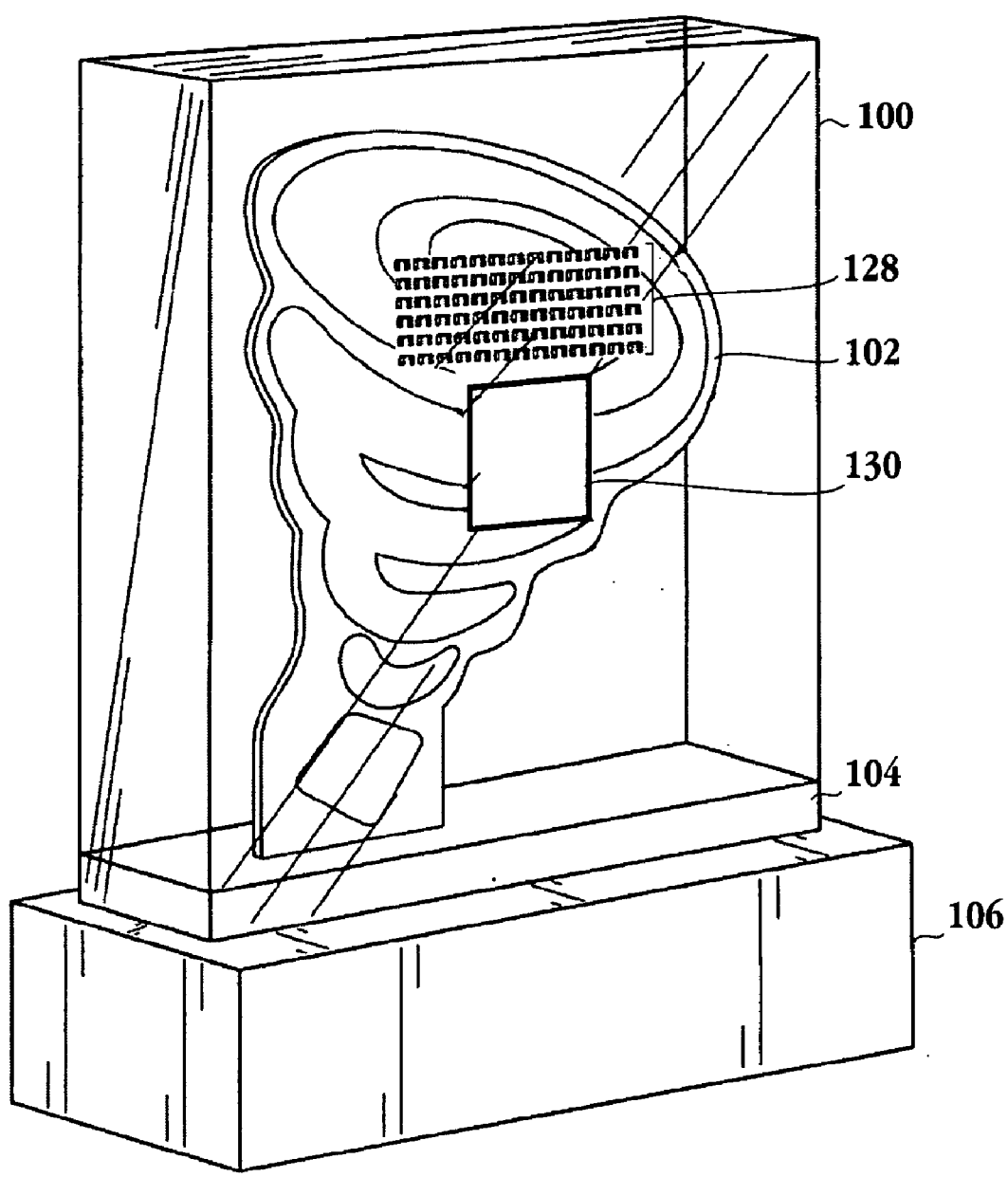
FIG. 1 is a perspective view of a demonstration tool for a programmable logic device (PLD) in accordance with one embodiment of the invention.

FIG. 1 is a perspective view of a demonstration tool for a programmable logic device (PLD) in accordance with one embodiment of the invention. The demonstration tool includes a transparent housing 100 that encapsulates printed circuit board 102. Collar 104 anchors printed circuit board 102 and acts as a block to prevent the material making up transparent housing 100 from seeping down to base 106 during the formation of the transparent housing as described in more detail below. Collar 104 is affixed to a bottom surface of transparent housing 100. An opposing surface of collar 104 is affixed to a top surface of base 106. In one embodiment, base 106 and collar 104 are composed of an opaque version of the material used to form transparent housing 100. Transparent housing 100 is composed of a clear plastic material, e.g., LUCITE™ or some other suitable transparent plastic material that enables light emitting diode panel 128, and the other electronic components of circuit board 102, to be visible. The front side of printed circuit board 102 also includes programmable logic device 130. In one embodiment, the programmable logic device is a field programmable gate array (FPGA), such as the CYCLONE™ family of field programmable gate arrays owned by the assignee. In another embodiment, LED panel 128 is an 8×21 LED panel, i.e., there are 168 LEDs on the panel.

Figure 2:
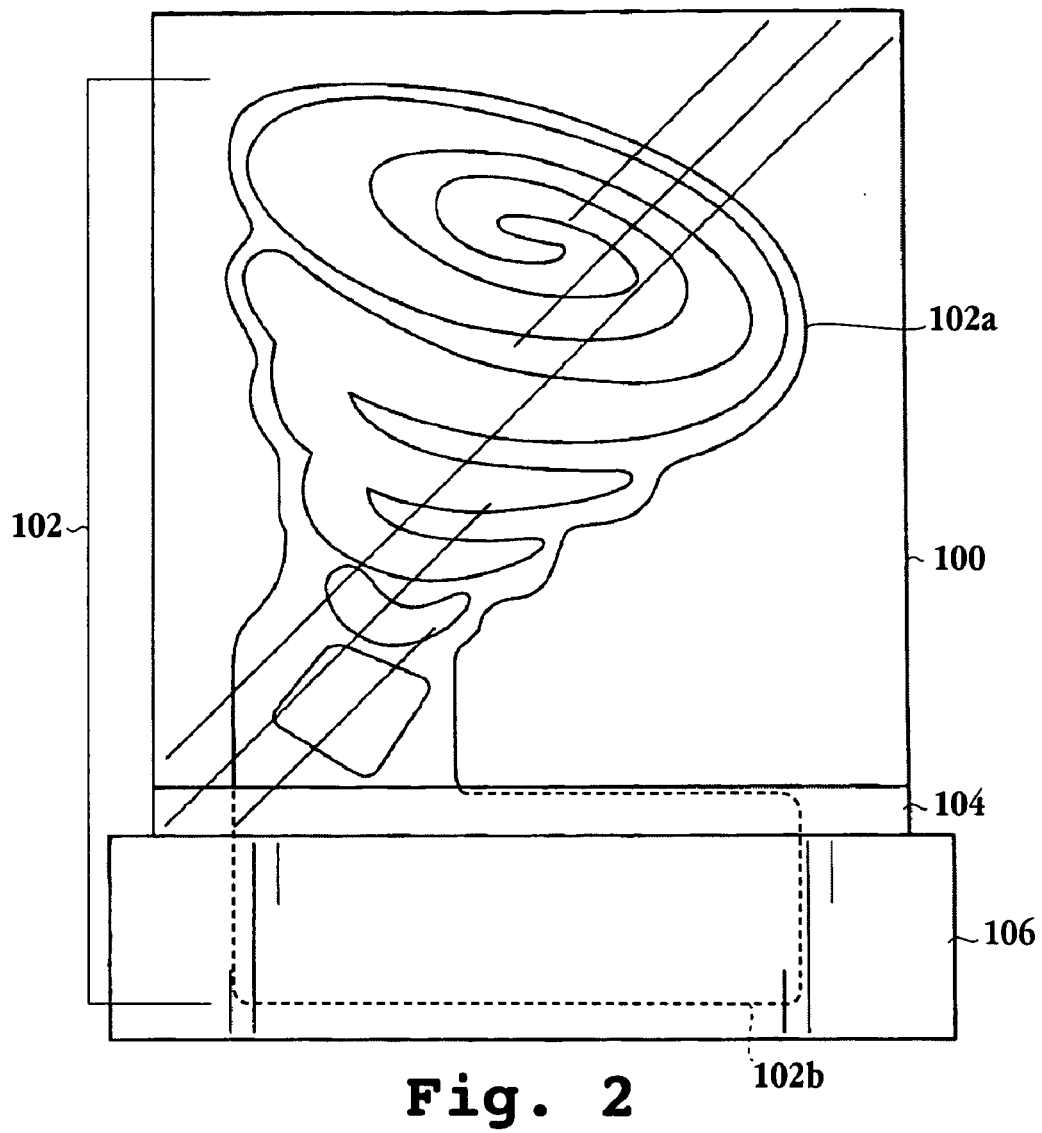
FIG. 2 is a front view of the demonstration tool of FIG. 1.

FIG. 2 is a front view of the demonstration tool of FIG. 1. Here, printed circuit board 102 is shown having a top portion 102a and a bottom portion 102b. Bottom potion 102b is located behind base 106 in the view of FIG. 2. As shown, top portion 102a is embedded in transparent housing 100, while bottom portion 102b extends outside of the transparent housing. Collar 104 includes an aperture that top portion 102a may slide through. In one embodiment, base 106 is open at the backside in order to allow access to bottom portion 102b of printed circuit board 102. As mentioned above, transparent housing 100, collar 104, and base 106 may be composed of the same material. However, transparent housing 100 is clear, while base 106 and collar 104 are opaque, i.e., black, in one embodiment. In another embodiment, transparent housing is a solid cube having a height and width of about four inches and a depth of about 1.25 inches. Collar 104 is about ⅜ of an inch thick, i.e., the distance from the bottom surface of transparent housing 100 to the top surface of base 106. Base 106 is approximately 1.125 inches tall. Of course, these measurements are exemplary and not meant to be limiting.

Printed circuit board 102 is shown having a distinctive shape in FIGS. 1 and 2. It should be appreciated that this shape is shown for exemplary purposes only and printed circuit board 102 may be any suitable shape such as the traditional square and rectangle shape. Alternatively, printed circuit board 102 may be a triangular shape or circular shape. Likewise, transparent housing 100 is illustrated as substantially a square two-dimensional shape for exemplary purposes. The two-dimensional shape of housing 100 may be made to mimic any of the above-mentioned shapes of printed circuit board 102. In addition, the three dimensional shape of transparent housing may be altered from the cubic illustration to other suitable three-dimensional shapes, e.g., cylindrical, spherical, diamond, etc.

Figure 3:
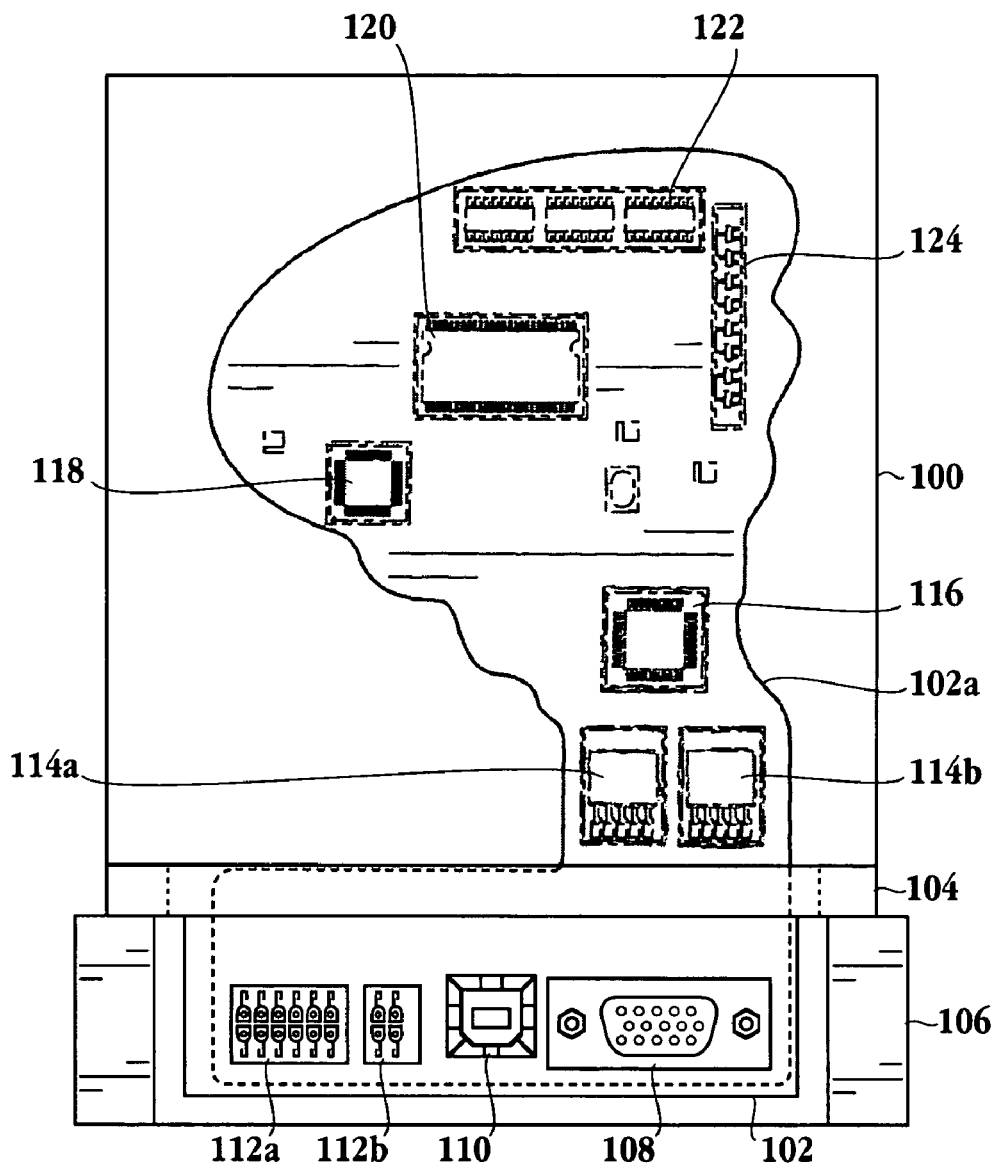
FIG. 3 is a backside view of the demonstration tool of FIG. 1.

FIG. 3 is a backside view of the demonstration tool of FIG. 1. Here, top portion 102a of the embedded circuit board contains additional logic and integrated circuits in order to drive the LED panel illustrated on the opposing front side of the circuit board in FIG. 2. Power converters 114a and 114b provide step-down switch regulation from power delivered through power supply connector 110 of bottom portion 102b. Complex programmable logic device 116, e.g., the MAX™ family of products of the assignee, provides configuration capability for the PLD illustrated on the front side of the circuit board in FIG. 2. Integrated circuit 118 may be configured to provide functionality in order to drive a video graphics array (VGA) monitor through VGA port 108 of bottom portion 102b of the circuit board. Memory 120 may be a SDRAM memory chip. Circuitry 122 represents the LED column drivers while circuitry 124 represents LED row drivers for the LED panel illustrated on the front side of the circuit board in FIG. 2.

Still referring to FIG. 3, power supply connector 110 provides power to drive the LED panel and the circuitry of the circuit board defined by top portion 102a and bottom portion 102b. In one embodiment, power supply connector 110 is a Universal Serial Bus (USB) port. Thus, the demonstration tool may be powered by linking connector 110 to a USB port of a computing device. It should be appreciated that a current of 5 milliamps from the USB port will provide the necessary power for running the demonstration tool in this embodiment. Input/Output (I/O) Ports 112a and 112b provide programming capability and configuration management of the programmable logic devices associated with the printed circuit board. Collar 104 includes aperture 126 enabling top portion 102a of the printed circuit board to slide through. Bottom portion 102b of the printed circuit board extends outside of transparent housing 100. Base 106 is configured to support the demonstration tool so that ports 108, 110, 112a, and 112b are all accessible. Additionally, base 106 extends below bottom portion 102b in order to support the demonstration tool and protect bottom portion 102b of the circuit board and the corresponding components.

Figure 4A:
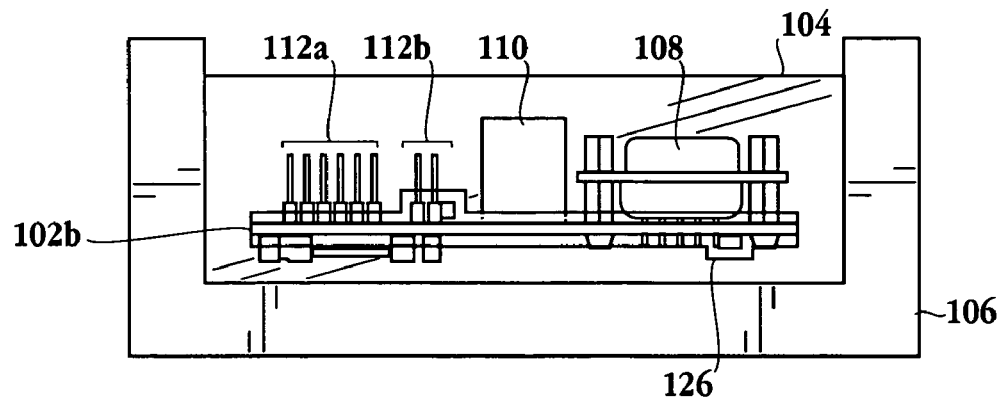
FIG. 4A is a bottom view of the demonstration tool of FIG. 1.

FIG. 4A is a bottom view of the demonstration tool of FIG. 1. Here, base 106 is configured as a three-sided channel to enable access to the backside of bottom portion 102b of the circuit board. This configuration allows access to VGA port 108, power supply connector 110, and I/O ports 112a and 112b. Collar 104 includes an aperture 126, also referred to as an opening, allowing the top portion of the printed circuit board to slide through. As will be described in more detail below, aperture 126 enables the printed circuit board to be anchored while the top portion of the circuit board is encapsulated within the transparent housing.

Figure 4B:
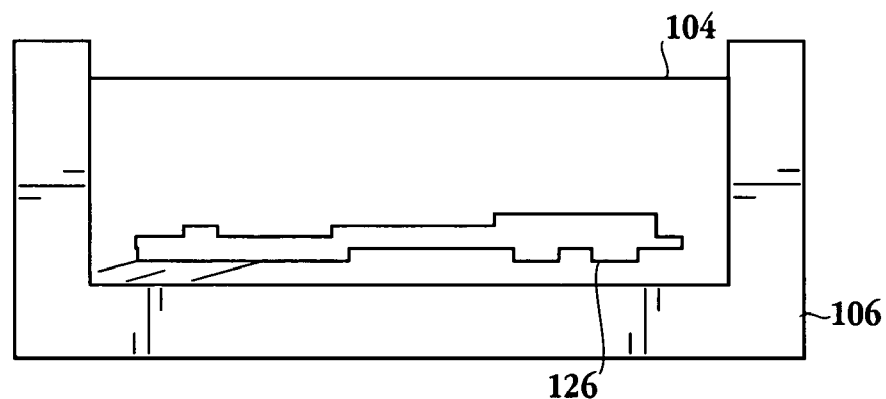
FIG. 4B illustrates the bottom view of FIG. 4A having an aperture defined through the collar absent an accompanying printed circuit board for illustrative purposes.

FIG. 4B illustrates the bottom view of FIG. 4A having an aperture defined through the collar absent an accompanying printed circuit board for illustrative purposes. Here, collar 104 is disposed over base 106. Collar 104, which may be referred to as a support section, includes aperture 126 defined therethrough. It should be appreciated that aperture 126 is cut, e.g., laser scribed, in a pattern to allow the integrated circuits and other modules disposed on either side of the printed circuit board to pass through. The solid part of collar 104 acts to restrain the plastic material from seeping down to the bottom portion of the circuit board during the processing operation described below.

Figure 5A:
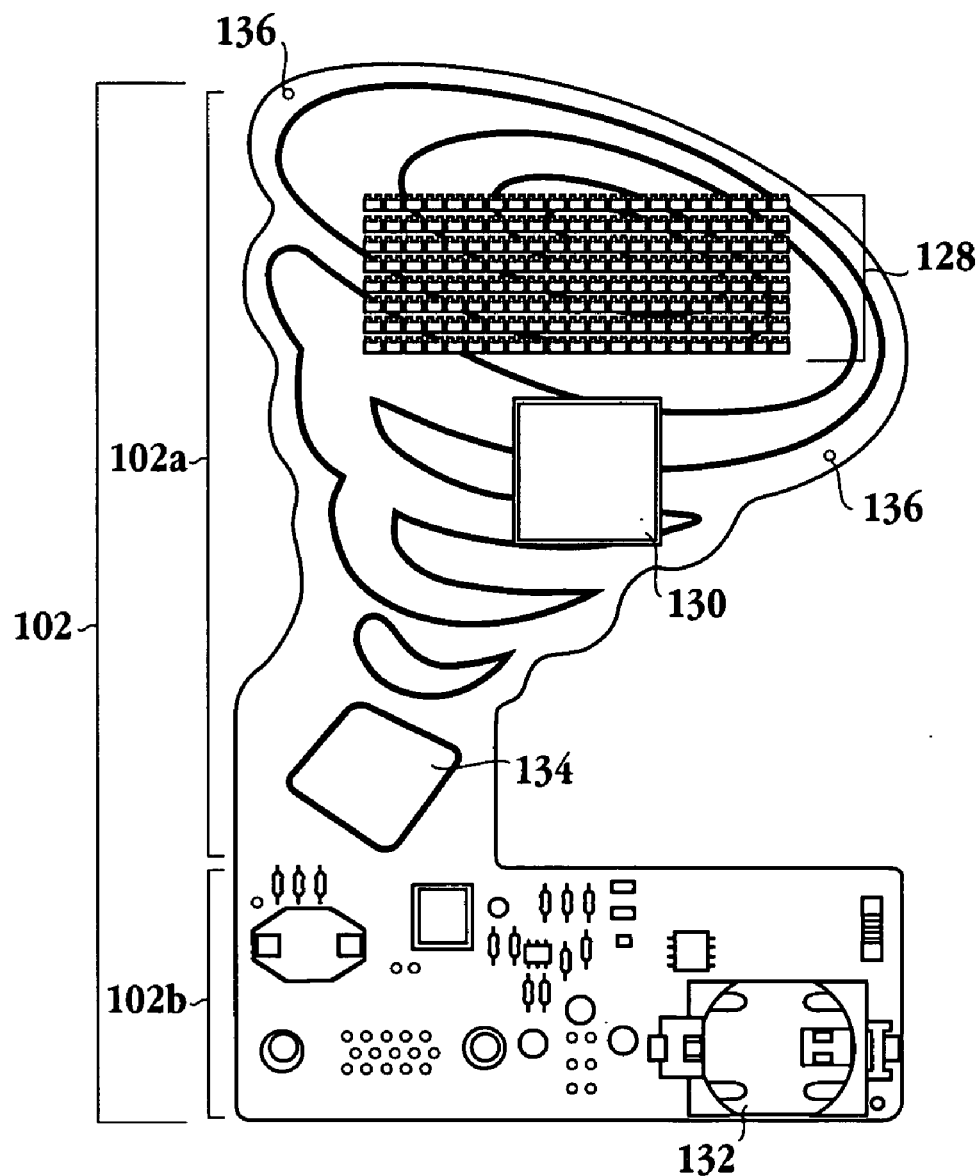
FIGS. 5A and 5B are more detailed schematic diagrams depicting the circuitry on the printed circuit board in accordance with one embodiment of the invention
Figure 5B:
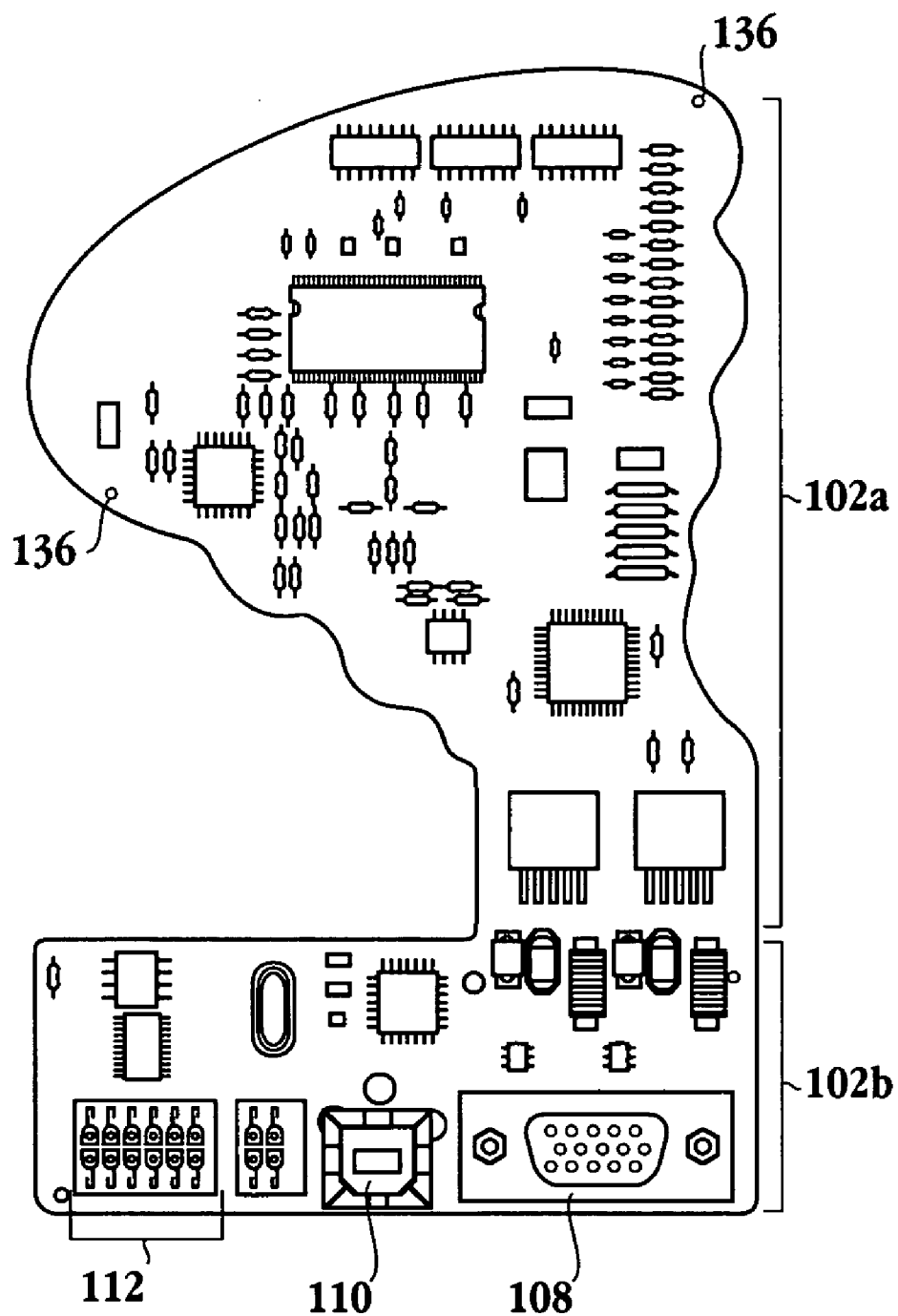

FIGS. 5A and 5B are more detailed schematic diagrams depicting the circuitry on the printed circuit board in accordance with one embodiment of the invention. Printed circuit board 102 of FIG. 5A, includes top portion 102a and bottom portion 102b. Top portion 102a includes LED panel 128 and field programmable gate array 130. In one embodiment, region 134 of top portion 102a includes signal indicators, e.g., LED's which indicate status modes. The status modes may include a run indicator LED and a power indicator LED. Front side of bottom portion 102b includes battery socket 132 that enables the incorporation of a real time clock. Thus, through the circuitry described herein, the actual time, among other functionality, may be displayed on LED panel 128, as programmed through PLD 130.

FIG. 5B illustrates a backside of the printed circuit board of FIG. 5A. Here again, the printed circuit board includes top portion 102a and bottom portion 102b. The bottom portion 102b includes port connectors 108, 110 and a single bank of I/O connectors 112. Static discharge pins 136, to assist in electrostatic discharge protection, are incorporated through printed circuit board 102 as illustrated in FIGS. 5A and 5B. It should be noted that the cyclone shape of printed circuit board 102 is exemplary and not meant to be limiting. For example, printed circuit board 102 may easily be converted to a rectangular or square shape and still fit through the aperture discussed with reference to FIGS. 4A and 4B. It will be apparent to one skilled in the art that the circuitry disposed on the front and back of printed circuit board 102 is shown for illustrative purposes. That is, other circuitry providing alternative features and functionality may be disposed on printed circuit board 102, as well as being placed in different locations on the circuit board. In one embodiment, the programmable logic device and/or the LED panel may be located on the same side as the other circuitry. Of course, the shape of the circuit board and the placement of the components will change.

Figure 6:
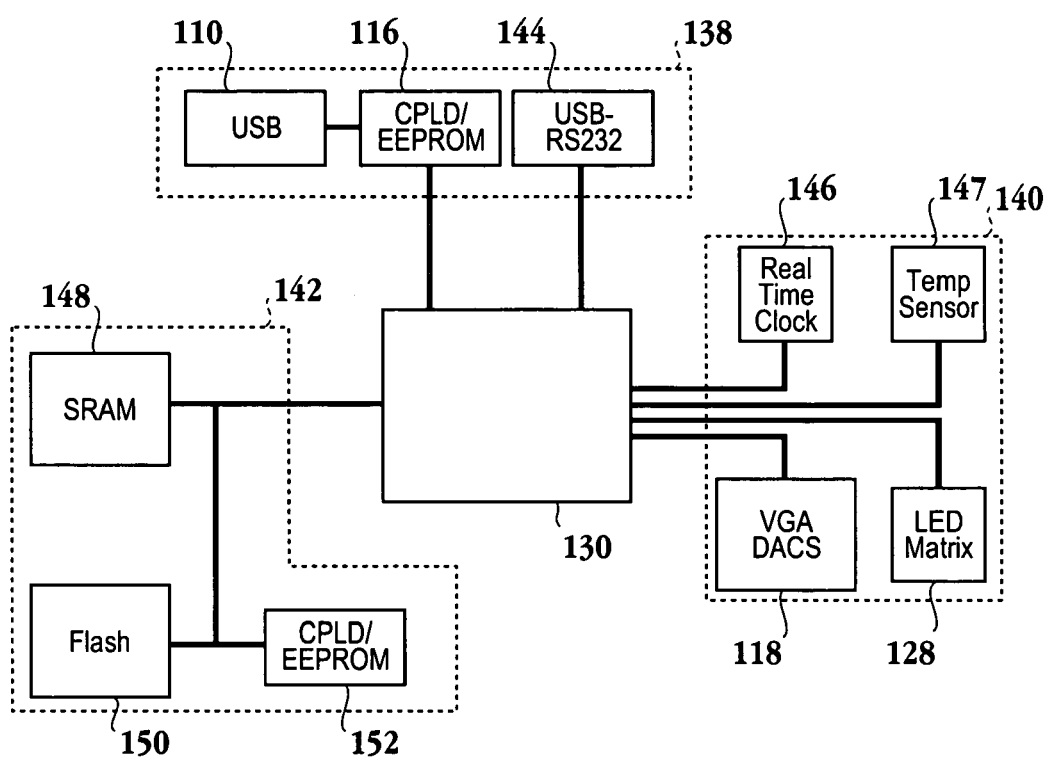
FIG. 6 is a simplified system block diagram of an exemplary circuit layout incorporated onto the printed circuit board of the demonstration tool in accordance with one embodiment of the invention.

FIG. 6 is a simplified system block diagram of an exemplary circuit layout incorporated onto the printed circuit board of the demonstration tool in accordance with one embodiment of the invention. Here, programmable logic device 130 is in communication with communication/power/Joint Test Action Group (JTAG) configuration module 138, peripherals module 140, and memory configuration module 142. Module 138 includes USB port 110, complex PLD/electrically erasable programmable read only memory (EEPROM) 116, and USB module 144, which has the capability of providing printing functionality through an RS232 connection. Peripheral module 140 includes LED matrix 128, temperature sensor circuitry 144, real time clock circuitry 146 and VGA digital to analog converter module 118. Memory and configuration module 142 includes static random access memory (SRAM) 148, flash memory 150 and complex PLD/EEPROM 152. In one embodiment, complex PLD/EEPROM 116 and 152 are from the MAX™ family of products of the assignee. It will be apparent to one skilled in the art that alternative circuit layouts may be incorporated dependent upon the features to be illustrated through the demonstration tool, as FIG. 6 is shown for exemplary purposes only.

Figure 7:
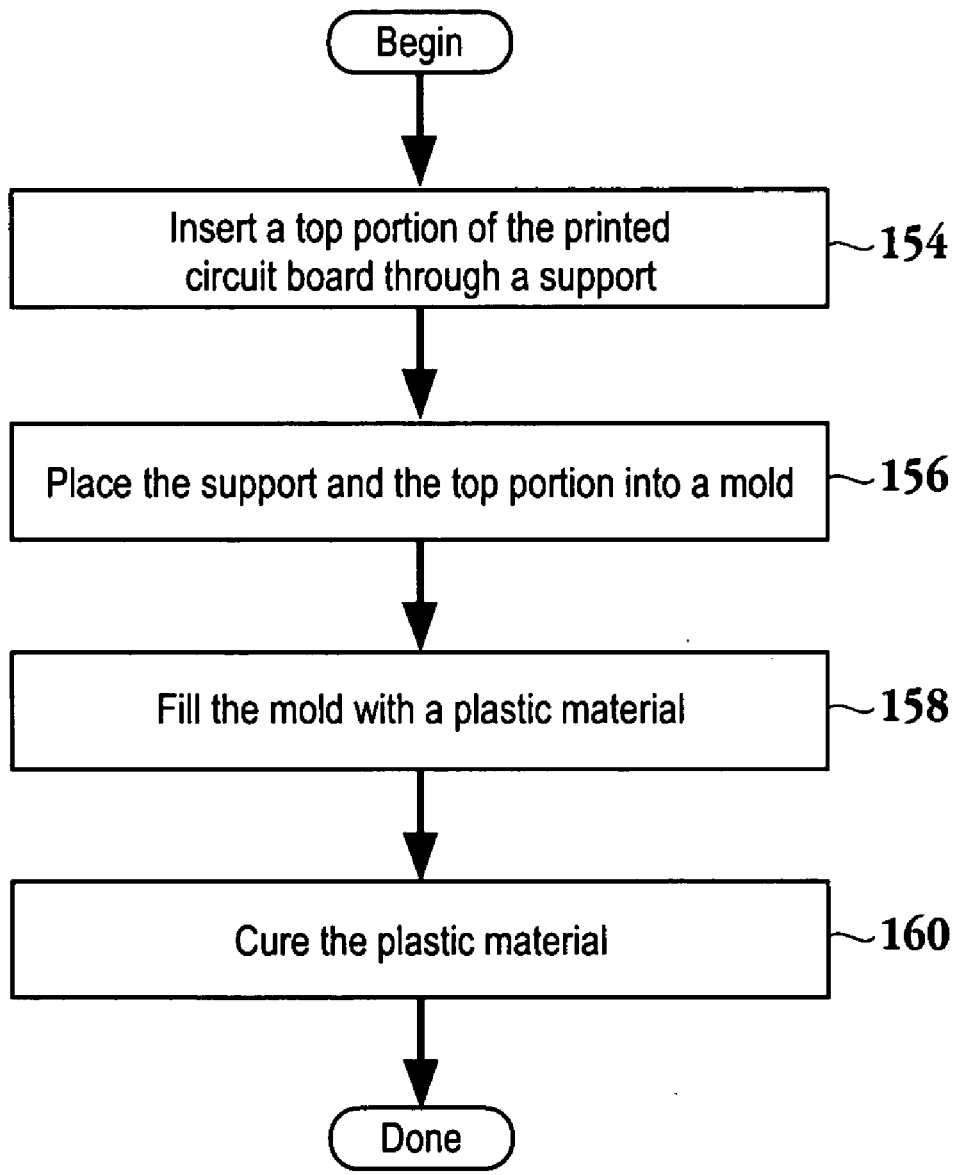
FIG. 7 is a flow chart diagram of the method operations for embedding a printed circuit board in accordance with one embodiment of the invention.

FIG. 7 is a flow chart diagram of the method operations for embedding a printed circuit board in accordance with one embodiment of the invention. The method initiates with operation 154 where a top portion of the printed circuit board is inserted through a support section. Here, the support section may be the collar illustrated in FIGS. 4A, 4B, 8 and 9. The method advances to operation 156 where the support section and the top portion of the printed circuit board are placed into a mold. Thus, the bottom portion of the printed circuit board extends past the bottom surface of the support section and does not enter into the mold. An illustration of operations 154 and 156 is provided with reference to FIG. 9. The method then moves to operation 158 where the mold is filled with a plastic material. In one embodiment, Polymethyl Methacrylate, commonly known as LUCITE™ is used as the plastic material.

Figure 9:
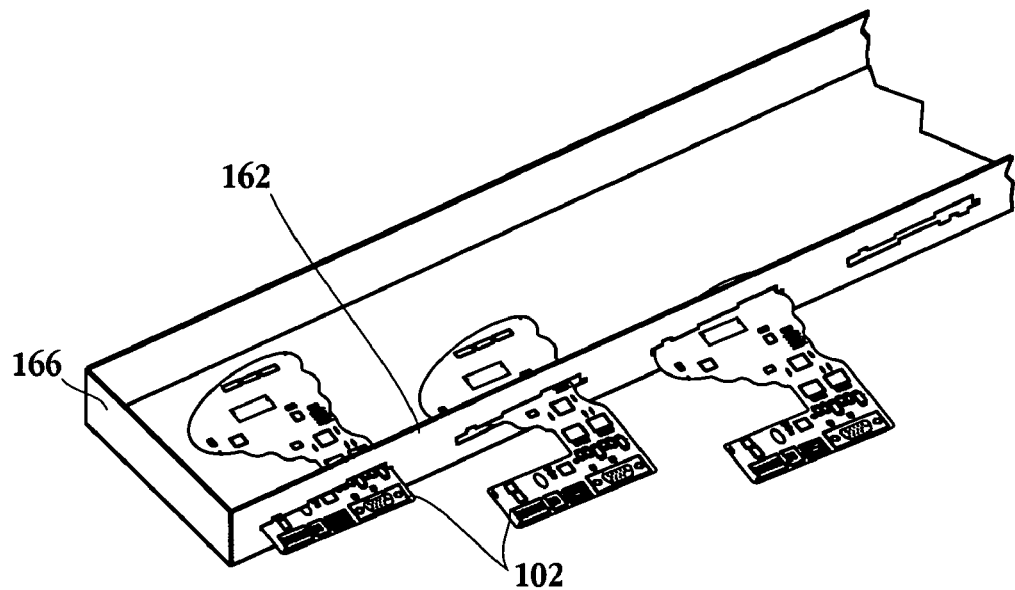
FIG. 9 is a schematic diagram of the printed circuit boards being inserted through an aperture of the bar of FIG. 8 and placed into a mold tray in accordance with one embodiment of the invention.

The method of FIG. 7, then proceeds to operation 160 where the plastic material is cured. An exemplary curing process of the plastic material includes heating the plastic material for a period of time, then cooling the plastic material upon expiration of the period of time, and thereafter polishing the cured plastic material. Details of the processing of the Polymethyl Methacrylate into a transparent solid block having the circuit board embedded therein are as follows: Polymethyl Methacrylate is originally in a viscous fluid form and is poured over the top portion of the printed circuit board. Referring to FIG. 9, printed circuit board 102 is inserted through the aperture defined within bar 162. Bar 162 is then placed into mold tray 166. In one embodiment bar 162 is has eight apertures to support eight printed circuit boards. The Polymethyl Methacrylate is then poured into mold tray 166.

It should be appreciated that bar 162 of FIG. 9 eventually defines the collar for a single demonstration tool, which acts as a dam to prevent the Polymethyl Methacrylate from seeping to the bottom portion of printed circuit 102. Additionally, bar 162 provides support for the printed circuit board to keep the board substantially parallel to a bottom surface of mold tray 166. After a period of time, e.g., about eight hours, mold tray 162 containing the poured material is placed into an autoclave and heated in order to initiate an exothermic reaction. An exemplary heating process raises the temperature to approximately 160 degrees Fahrenheit in the autoclave. The pressure within the autoclave is approximately 225 pounds per square inch (psi) for two hours. The exothermic reaction, which initiates after about 2 hours causes the temperature to rise to about 400 degrees Fahrenheit, and the pressure to increase to about 300 psi. After approximately another two hours, the material is cooled in the autoclave for a period of time, e.g., about three hours. The cooled strip of 8 circuit boards in the mold tray, referred to as an ingot, is then cut and polished to for the demonstration tool illustrated herein. A base is subsequently affixed to the bottom surface of the collar.

It should be appreciated that the high temperature and high pressure experienced by the circuit board during the processing may be damaging to the components of the circuit board. Furthermore, the solid block defining the transparent housing exerts a pressure of about 500 psi on the circuit board when the thickness of the transparent housing is about 1.25 inches. As the thickness of the transparent housing increase, this internal pressure exerted on the circuit board increases. Thus, the components on the circuit board may be prepared for these conditions. For example, an acrylic resin may be wicked, i.e., carried by capillary action, underneath the integrated circuits in order to create a barrier to occlude the plastic material. One skilled in the art will appreciate that an exemplary acrylic resin is cyanoacrylate, commonly known as superglue.

In one embodiment, Indium Tin Oxide (ITO) is added in with the Polymethyl Methacrylate up to 1% by weight of ITO. The ITO is a transparent metal that assists in dissipating static electricity and provides more thermal mass to the transparent housing. The solid block of the transparent housing may cause reflections from the light emitted by the LEDs of the LED panel. In order to prevent the reflections each of the covers of the LEDs has a refractive index substantially similar to the refractive index of the transparent housing, i.e., Polymethyl Methacrylate or the combination of Polymethyl Methacrylate and ITO. One exemplary material having a refractive index similar to the combination of Polymethyl Methacrylate and ITO is cyanoacrylate.

Figure 8:
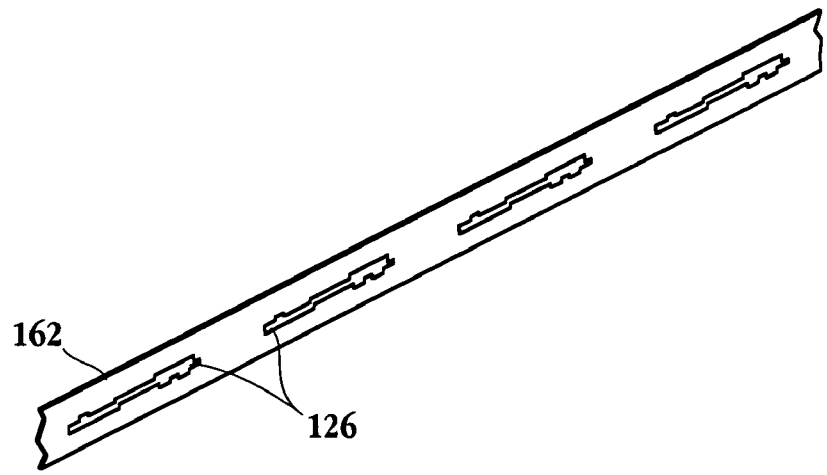
FIG. 8 is a schematic diagram of a bar having multiple collars in which the printed circuit boards may be inserted therethrough in accordance with one embodiment of the invention.

FIG. 8 is a schematic diagram of a bar having multiple collars in which the printed circuit boards may be inserted therethrough in accordance with one embodiment of the invention. Here, bar 162, which is composed of Polymethyl Methacrylate, includes a plurality of apertures 126. In one embodiment, eight apertures are included in bar 162, as discussed above with reference to FIG. 9. Thus, eight circuit boards may then be processed at one time. It should be appreciated that aperture 126 has been patterned to enable the circuit board to pass through as discussed with reference to FIGS. 4A and 4B.

In summary, the above-described invention provides a demonstration tool and a method for embedding an operational printed circuit board inside a solid block of transparent material. By extending the printed circuit outside of the solid block of transparent material, it is possible to eliminate the need to encapsulate the connectors. The access to signals is via connectors mounted on the extended portion of the circuit board. Thus, the connectors do not experience the high pressure exerted by the solid block. This pressure would eventually break the connector or the wire strands/cable of the connector even if the connector is welded to the connector. Furthermore, the connectors/cables are not exposed to the high processing temperatures and do not have to be modified to withstand these high temperatures.

It should be appreciated that the LED panel may display messages that run along the display in a marquis fashion or the messages may be flashing. In addition to displaying the time through the real time clock, the display may be used to display a stock ticker. It will be apparent to one skilled in the art that numerous other applications are capable of being performed by the demonstration tool depending on the configuration of the electronic components mounted on the circuit board.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. An apparatus, comprising:
    a printed circuit board having a top portion and a bottom portion, the top portion having a first side that includes a panel of light emitting diodes disposed thereon;
    a transparent housing disposed around the top portion, the transparent housing solid block molded around the top portion;
    a base affixed to the transparent housing; and
    a support section disposed between the base and the transparent housing, the support section having an aperture defined therethrough, the aperture enabling the top portion of the printed circuit board to slide through.

2. The apparatus of claim 1, wherein the printed circuit board includes a programmable logic device.

3. The apparatus of claim 1, wherein the transparent housing exerts a pressure against the top portion.

4. The apparatus of claim 3, wherein a second side of the printed circuit board opposing the first side includes circuitry for driving the panel of light emitting diodes.

5. The apparatus of claim 1, wherein the transparent housing is a solid block of plastic.

6. The apparatus of claim 1, wherein the printed circuit board is operational.

7. A demonstration tool for a programmable logic device, comprising:
    a Polymethyl Methacrylate block;
    a circuit board having a top portion, wherein the Polymethyl Methacrylate block is molded around the circuit board through a heating and cooling operation;
    a collar having an opening configured to allow the top portion of the circuit board to pass through, a top surface of the collar affixed to a bottom surface of the Polymethyl Methacrylate block; and
    a base affixed to a bottom surface of the collar, the base configured to allow access to an exposed bottom portion of the circuit board, wherein the circuit board includes a light emitting diode (LED) panel and a programmable logic device disposed on a first surface of the circuit board.

8. The demonstration tool of claim 7, wherein disposed over each LED of the LED panel is a plastic cover, the plastic cover being composed of a material having a refractive index substantially similar to Polymethyl Methacrylate.

9. The demonstration tool of claim 7, wherein the circuit board is composed of multiple plates disposed over each other, wherein one of the multiple plates is a copper plate.

10. The demonstration tool of claim 7, wherein the bottom portion of the circuit board includes a power supply connection.

11. The demonstration tool of claim 7, wherein circuitry for driving the LED panel is disposed on a second surface of the circuit board, the second surface opposing the first surface.

12. The demonstration tool of claim 10, wherein the power supply connection is a Universal Serial Bus port.

13. The apparatus of claim 1, wherein the pressure is greater than 300 pounds per square inch.

14. The apparatus of claim 1, wherein the transparent housing includes polymethyl methacrylate and Indium Tin Oxide.

15. The demonstration tool of claim 7, wherein the Polymethyl Methacrylate block exerts a pressure against the circuit board.

16. The demonstration tool of claim 7, wherein the Polymethyl Methacrylate block includes Indium Tin Oxide.

* * * * *